(12) United States Patent
Jung et al.

(10) Patent No.: US 6,335,279 B2
(45) Date of Patent: Jan. 1, 2002

(54) METHOD OF FORMING CONTACT HOLES OF SEMICONDUCTOR DEVICE

(75) Inventors: Soon Moon Jung; Sung Bong Kim; Joo Young Kim, all of Gyeonggi-do (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 09/739,211

(22) Filed: Dec. 19, 2000

(30) Foreign Application Priority Data

Jan. 27, 2000 (KR) .......................................... 2000-4086

(51) Int. Cl.[7] .............................................. H01L 21/44
(52) U.S. Cl. ..................... 438/666; 438/637; 438/303
(58) Field of Search ................................ 438/618–669, 438/299, 301–307

(56) References Cited

U.S. PATENT DOCUMENTS

| 5,652,176 A | | 7/1997 | Maniar et al. | |
| 5,763,312 A | | 6/1998 | Jeng et al. | |
| 6,033,962 A | * | 3/2000 | Jeng et al. | 438/301 |
| 6,159,839 A | * | 12/2000 | Jeng et al. | 438/618 |

* cited by examiner

Primary Examiner—Jey Tsai
(74) Attorney, Agent, or Firm—Volentine Francos, PLLC

(57) ABSTRACT

A method of forming contact holes of a semiconductor device wherein process yield is improved and manufacturing processes can be simplified. First, a plurality of gate electrodes provided with a plurality of spacers are formed on an active region of a semiconductor substrate that is separated into the active region and a field region by a field oxide layer. Then, the outermost spacers are removed from the plurality of spacers, to ensure a space for a first contact hole on the semiconductor substrate. Next, an etch stopping layer and an interlayer dielectric are subsequently formed on the semiconductor substrate. By etching the interlayer dielectric and the etch stopping layer subsequently, the first contact hole is formed by exposing a first surface of the semiconductor substrate between the gate electrodes and a second contact hole is formed by exposing a second surface of the semiconductor substrate which includes a portion of a surface of the field oxide layer and a portion of the semiconductor substrate near the field oxide layer, simultaneously. A manufacturing process of the semiconductor device can thus be simplified by forming contact holes simultaneously, using a self aligned contact method in which a first contact hole is formed by using a plurality of spacers and using a borderless contact method in which the second contact hole is formed from a side portion of the gate electrode to a portion of a field region.

18 Claims, 13 Drawing Sheets

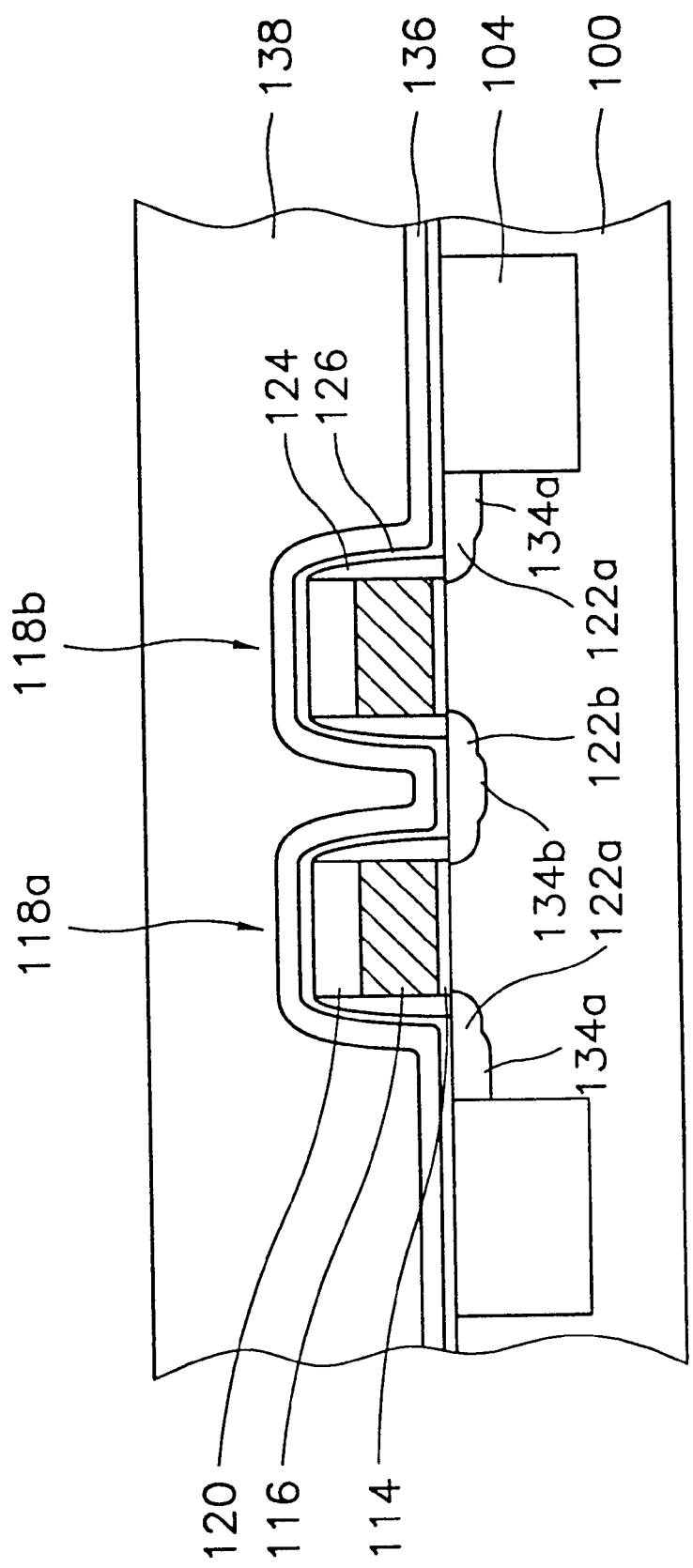

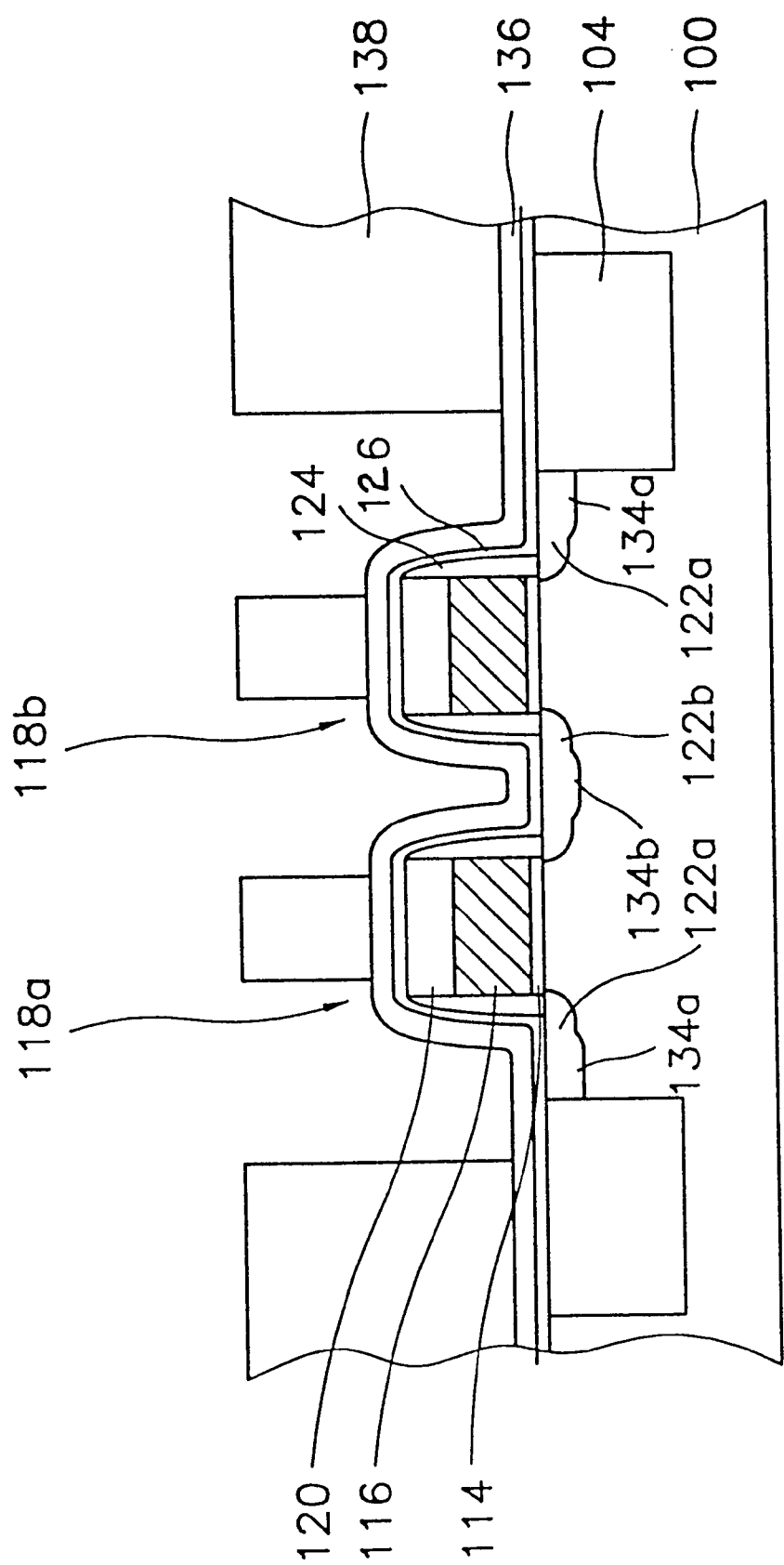

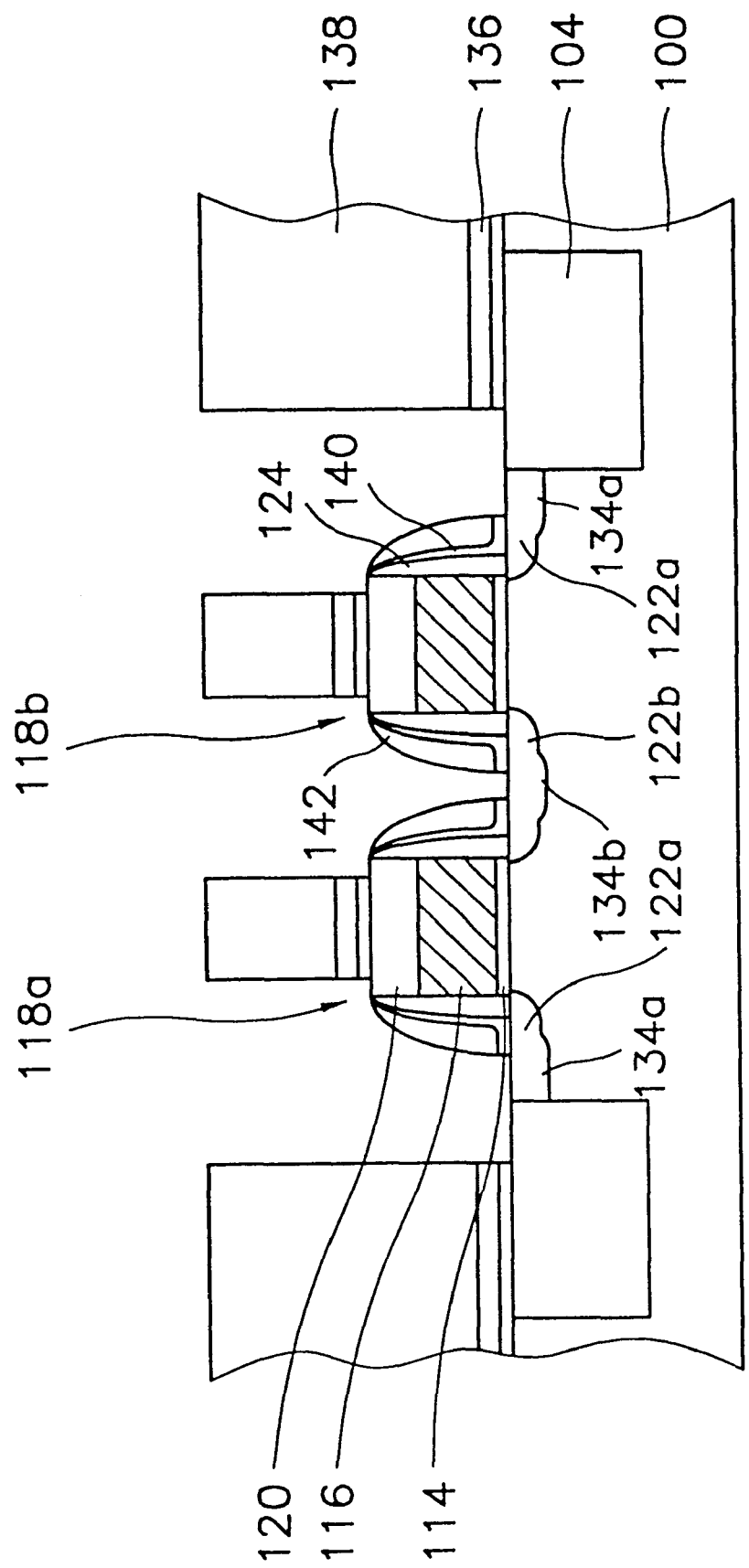

METHOD OF FORMING CONTACT HOLES OF SEMICONDUCTOR DEVICE

The present application claims priority under 35 U.S.C. §119 to Korean Application No. 2000-4086 filed on Jan. 27, 2000, and which is hereby incorporated by reference in its entirety for all purposes.

BACKGROUND OF THE INVENTION

1. Field of the Invention

The present invention relates to a method of forming contact holes of a semiconductor device, in particular, forming contact holes of a semiconductor device so that damage at a field oxide layer can be prevented and processing yield can be increased as a result.

2. Description of the Related Art

In order to reduce a layout area at a portion of a chip occupying a large-area, such as a CMOS memory cell, pattern sizes and intervals between patterns should be reduced in line with the increase of the integration degree. In particular, distance between gate electrodes should also be reduced so that contacts can be formed by utilizing a self aligned contact method by which a contact overlaps the gate electrode over the gate electrode region, to reduce the total layout area. In order to apply the self aligned contact method, an insulation layer that has an etching-resistance while being etched to form a contact hole, is formed on the gate electrode. The insulation layer prevents a short with the gate electrode formed from polysilicon material. Spacers also should be provided on both sides of the gate electrode. Furthermore, spacers are formed to isolate a heavily doped region from a conductive layer of the gate electrode when an LDD type MOS transistor is formed.

In general, the thickness of the spacer for forming the LDD type transistor depends on the characteristics of the transistor. As the integration degree of a semiconductor device is increased, the distance between the gate electrodes is decreased to twice the thickness of the spacer. Insulating spacers provided on both side walls of the gate electrode should remain after implementing an etching process for forming a contact hole by applying a self aligned contact method. Therefore, a contact region with an active region of a semiconductor substrate depends on the thickness of the spacer, regardless of the pattern shapes of the gate electrodes.

Accordingly, if the spacers are formed too thickly, the exposed portion of the active region becomes too narrow. In addition, when a dry etching process is implemented on this narrow active region, the etching can stop to form an incompletely etched hole, or it can stop to form a wiring layer having high resistivity, thereby inducing a defect. Furthermore, it is difficult to fill this narrow contact hole with a wiring layer having low resistivity.

U.S. Pat. No. 5,763,312 by Jeng et al. discloses a method of fabricating a semiconductor device having LDD spacers using double spacers. FIGS. 1A–1F are crosssectional views explaining a method of forming the LDD spacers illustrated in U.S. Pat. No. 5,763,312.

Referring to FIG. 1A, a gate electrode 10 including a gate oxide layer 4, a conductive pattern 6 and a first insulating pattern 8 is formed on an active region of a semiconductor substrate 1 which is separated into an active region and a field region by a field oxide layer 2.

Referring to FIG. 1B, a first impurity doped region 12 is formed on the semiconductor substrate 1 by doping impurities having a low concentration using the gate electrode 10 as a mask.

Referring to FIG. 1C, a second insulating layer (not shown) is formed by blanket depositing an insulating material, preferably silicon nitride, on the semiconductor substrate to a thickness of about 400–800 Å through a chemical vapor deposition method. Then, the second insulating layer is etched back to form first spacers 14 on the side walls of gate electrode 10. The thickness of first spacers 14 is about 300–700 Å.

Referring to FIG. 1D, a third insulating layer (not shown) is formed by blanket depositing an insulating material, preferably silicon oxide, to a thickness of about 400–1000 Å through a chemical vapor deposition method on the semiconductor substrate on which the gate electrode 10 and first spacers 14 are formed. Then, the third insulating layer is etched back to form second spacers 16 on first spacers 14. The thickness of second spacers 16 is about 200–800 Å.

Referring to FIG. 1E, a second impurity doped region 18 is formed within the first impurity doped region 12 after forming second spacers 16 by doping impurities of high concentration into the semiconductor substrate 1 using gate electrode 10, first spacers 14 and second spacers 16 as masks.

Referring to FIG. 1F, a fourth insulating layer (not shown) is formed on the semiconductor substrate 1. The fourth insulating layer is formed by blanket depositing BPSG (Boro-Phosphosilicate Glass) or PSG (Phosphosilicate Glass) to a thickness of about 3,000–10,000 Å through a low pressure chemical vapor deposition method or a PECVD (Plasma Enhanced Chemical Vapor Deposition Method).

Next, a mask pattern (not shown) is formed on the fourth insulating layer to form contact holes. Then, the fourth insulating layer is etched by using the mask pattern as an etching mask to form contact holes in order to expose the surface of the semiconductor substrate 1 including first and second impurity doped regions 12 and 18.

However, according to the method of forming the LDD spacers of the semiconductor device, the third insulating layer and the field oxide layer are formed from the same or similar materials. As a result, the etching ratios of the third insulating layer and the field oxide layer are identical or similar. Accordingly, a problem occurs in that a portion of the field oxide layer may be etched during implementation of the etch back process on the third insulating layer to form the second spacers. When this portion of the field oxide layer is etched, the ability of the field oxide layer to isolate each cell is reduced, thus leading to erroneous operation of the manufactured device.

Recently, the width of a contact hole has been reduced as an integration degree of semiconductor device has increased. However, the reduction of the width of the contact hole is limited. To solve this problem, a method of forming a non-overlapping contact or a borderless contact has been developed. Through this method, a distance between the contact hole and the gate electrode is kept constant while the size of the contact hole is not reduced. The contact hole is formed to overlie both active and field oxide regions.

Initially, a borderless contact method is applied by etching an interlayer dielectric formed on a semiconductor substrate to expose a portion of a field oxide layer and an adjacent surface portion of the semiconductor substrate. However at this time, a problem of forming a recess on the exposed field oxide layer is generated. That is, the depth of the recess is deeper than a source/drain junction of an active region, or is near a junction boundary, and thus a path of direct contact between a contact that is formed afterward and the semiconductor substrate results. This will induce a current leakage.

In addition, even if the contact hole is shallower than the source/drain junction of the active region, Ti and TiN which are applied to form a barrier layer during a process of forming a contact that is implemented afterward, react with silicon at the source/drain region during a heat treatment, if the contact hole is formed near the junction. When Ti and TiN react with silicon, a conductive silicide layer is formed to generate a current leakage.

In order to solve the above-described problem, a method of forming an etch stopping layer to stop an etching process for formation of a contact hole and to prevent a recess of a field oxide layer from being formed, is disclosed in U.S. Pat. No. 5,652,176 by Maniar et al. FIGS. 2A to 2D are cross-sectional views explaining the conventional method of forming a borderless contact.

Referring to FIG. 2A, a mask pattern is formed on a semiconductor substrate 30 and a trench is formed by etching semiconductor substrate 30 using the mask pattern as an etching mask. The depth of the trench from the surface of semiconductor substrate 30 is about 4,000–6,000 Å and the width of that is about 4,000–6,000 Å. Next, the mask pattern formed on the surface of the semiconductor substrate is removed and an oxide material is blanket deposited on the semiconductor substrate with a thickness that is sufficient enough to fill the trench. Silicon oxide, TEOS (Tetra-Ethyl-Ortho-Silicate), and the like can be used for the oxide material, and a chemical vapor deposition method is preferred. Subsequently, a planarization process is implemented until semiconductor substrate 30 is exposed to form a field oxide layer 32 within semiconductor substrate 30. Then, semiconductor substrate 30 is separated into an active region and a field region by field oxide layer 32.

Referring to FIG. 2B, a gate electrode including a gate oxide layer 34, a conductive pattern 36 and a capping layer pattern 38 is formed on the active region of semiconductor substrate 30. Then, a common ion doping process is implemented by using the gate electrode as a mask to form a first impurity region 40 within semiconductor substrate 30. Subsequently, an insulating material is deposited on semiconductor substrate 30 and it is etched back to form spacers 42 on the side walls of the gate electrode. Then, a second impurity region 44 is formed within semiconductor substrate 30 by implementing a common ion doping process and using spacers 42 as a mask.

Referring to FIG. 2C, an etch stopping layer 46 is formed by blanket depositing silicon nitride on the whole surface of semiconductor substrate 30. Etch stopping layer 46 functions to protect field oxide layer 32 during the subsequent etching process. Then, an interlayer dielectric 48 is formed on the semiconductor substrate 30 on which etch stop layer 46 is formed. The interlayer dielectric 48 is formed by blanket depositing an insulating material such as silicon oxide, BPSG or PSG to a thickness of about 3,000–10,000 Å through a low pressure chemical vapor deposition method or a plasma enhanced chemical vapor deposition method.

Referring to FIG. 2D, a photoresist pattern (not shown) is formed on the interlayer dielectric 48 using a common photolithography. Then, the interlayer dielectric 48 and etch stopping layer 46 are successively etched by using the photoresist pattern as an etching mask to expose a portion of the surface of the semiconductor substrate 30 from a portion of field oxide layer 32 to a portion of the gate electrode that is adjacent to the field oxide layer 32, and to form a contact hole which forms the borderless contact.

However, the above-described borderless contact method and a self aligned contact method by which spacers are formed on the sidewalls of the gate electrode are used as processing margins, so the two methods cannot be applied simultaneously. That is, for the self aligned contact method, thick double spacers are formed on the sidewalls of the gate electrode to ensure the processing margin while forming the contact hole. On the other hand, for the borderless contact method, an etch stopping layer is formed on the whole surface of the semiconductor substrate before forming the interlayer dielectric, which prevents the field oxide layer from being etched. If both the self aligned contact method and the borderless contact method are applied simultaneously, the etch stopping layer might completely fill an interval between gate electrodes.

Therefore, the etching process to form the contact hole is implemented until the surface of the semiconductor substrate near the boundary of the active region and field region is completely exposed in order to form a contact hole of the borderless contact. However, the surface of the semiconductor substrate between the gate electrodes on which the contact hole is to be formed is not completely exposed and the contact hole is not completely opened. Otherwise, when the etching process forming the contact hole proceeds until the surface of the semiconductor substrate on which the contact hole is to be formed between the gate electrodes is exposed, the surface of the semiconductor substrate on which the contact hole is to be formed at the boundary of the active region and the field region is excessively etched.

SUMMARY OF THE INVENTION

The present invention is therefore directed to a method of forming contact holes of a semiconductor device which substantially overcomes one or more of the problems due to the limitations and disadvantages of the related art.

An object of the present invention is to provide a method of forming contact holes of a semiconductor device in which damage at a field oxide layer of the semiconductor device can be prevented and in which processing yield can be increased.

Another object of the present invention is to provide a method of forming contact holes of a semiconductor device in which a self aligned contact method and a borderless contact method can be applied simultaneously, so that a manufacturing process of a device can be simplified.

To accomplish these objects, a method of forming contact holes of a semiconductor device is provided in the present invention. First, a plurality of gate electrodes provided with a plurality of spacers are formed on an active region of a semiconductor substrate which is separated into the active region and a field region by a field oxide layer. Then, the outermost spacers are removed from the plurality of spacers in order to ensure a space for forming a first contact hole on the semiconductor substrate. Next, an etch stopping layer and an interlayer dielectric are subsequently formed on the semiconductor substrate. By subsequently etching the interlayer dielectric and the etch stopping layer, the first contact hole is formed by exposing a first surface of the semiconductor substrate between the gate electrodes and a second contact hole is formed by exposing simultaneously a second surface of the semiconductor substrate which includes a portion of a surface of the field oxide layer and a portion of the semiconductor substrate near the field oxide layer.

According to the present invention, a manufacturing process of a DRAM device can be simplified by forming contact holes simultaneously with a self aligned contact method in which the first contact hole is formed by using a plurality of spacers and with a borderless contact method in which the second contact hole is formed from a side portion of the gate electrode to a portion of a field region. This result can be obtained by forming a plurality of gate electrodes having a plurality of spacers to form an LDD structure, by removing the outermost spacers to ensure a space for forming a first contact hole between the gate electrodes and then by forming an etch stopping layer to prevent a field region and an interlayer dielectric from being etched.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 3A to 3M are cross-sectional views explaining an embodiment of a method of forming contact holes according to the present invention.

DESCRIPTION OF THE PREFERRED EMBODIMENT

The present invention will be explained in more detail with reference to the attached drawings herein below.

Figure 1A:
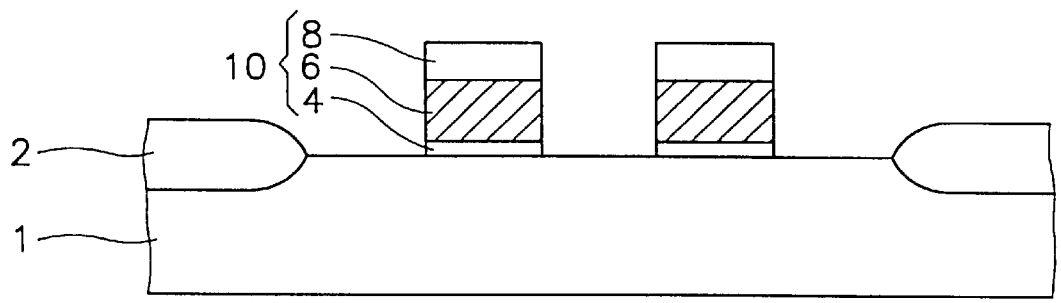
FIGS. 1A to 1F are cross-sectional views explaining a conventional method of forming contact holes by using a spacer to form an LDD structure.
Figure 1B:
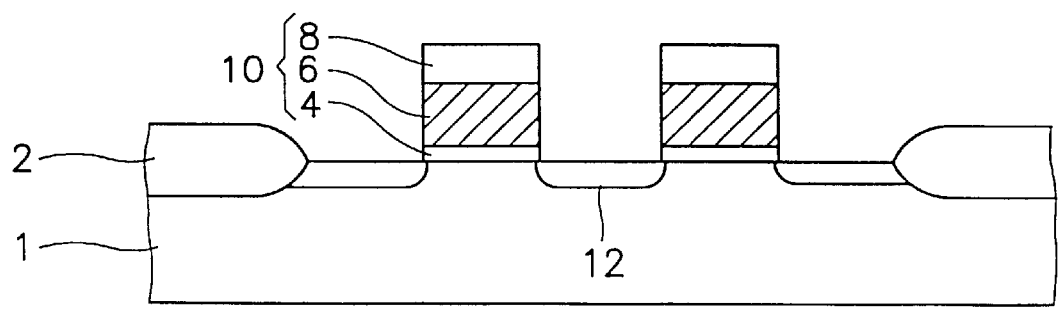
Figure 1C:
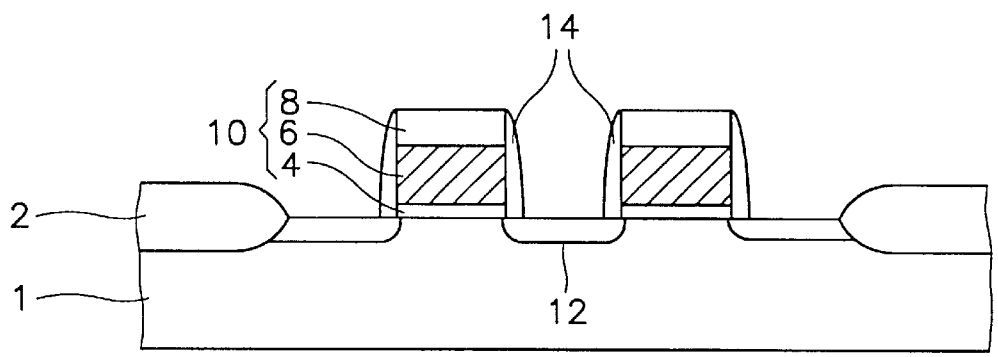
Figure 1D:
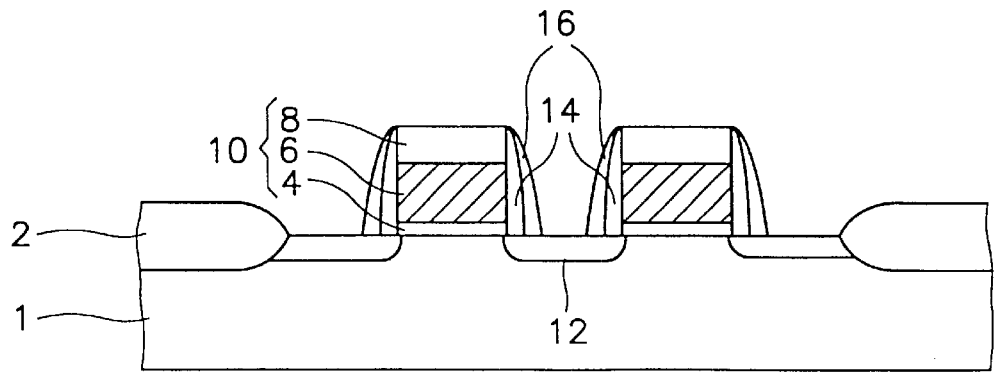
Figure 1E:
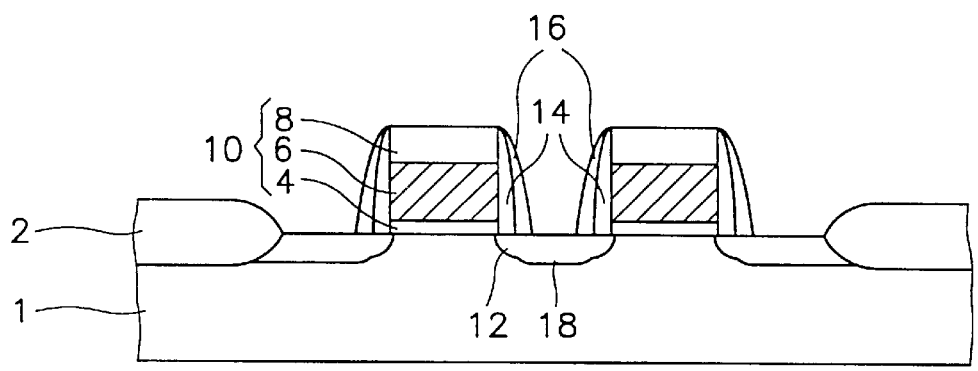
Figure 1F:
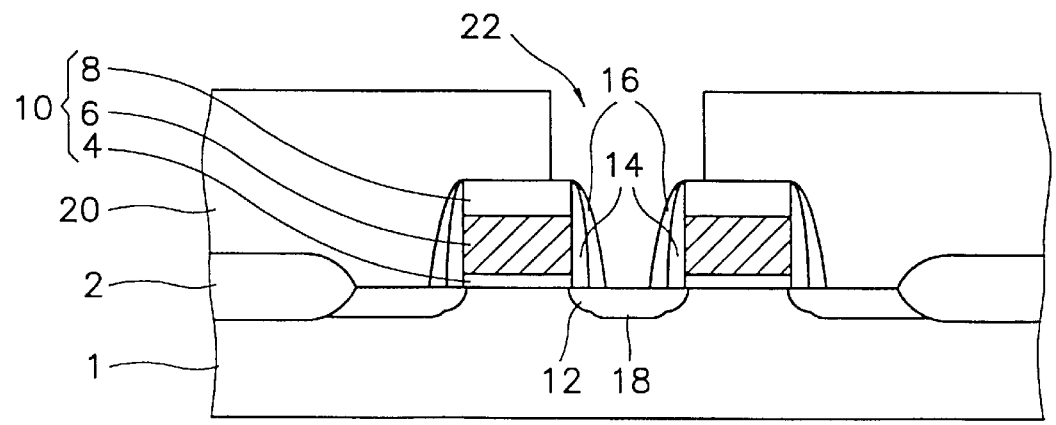
Figure 2A:
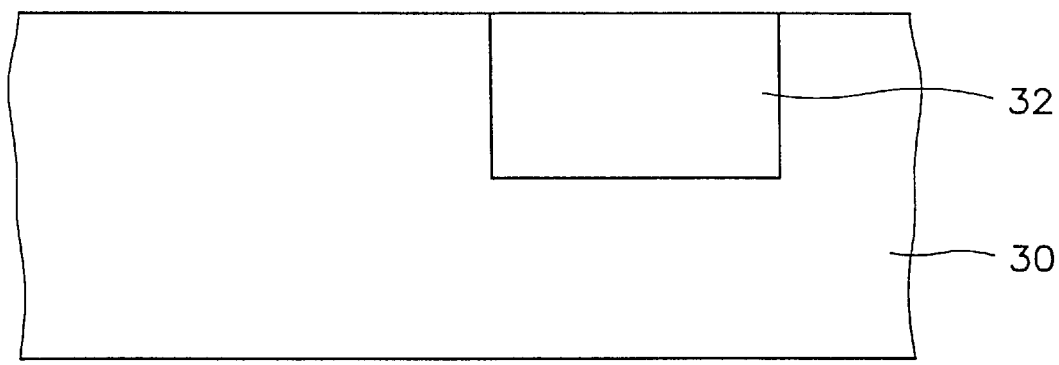
FIGS. 2A to 2D are cross-sectional views explaining another conventional method of forming contact holes.
Figure 2B:
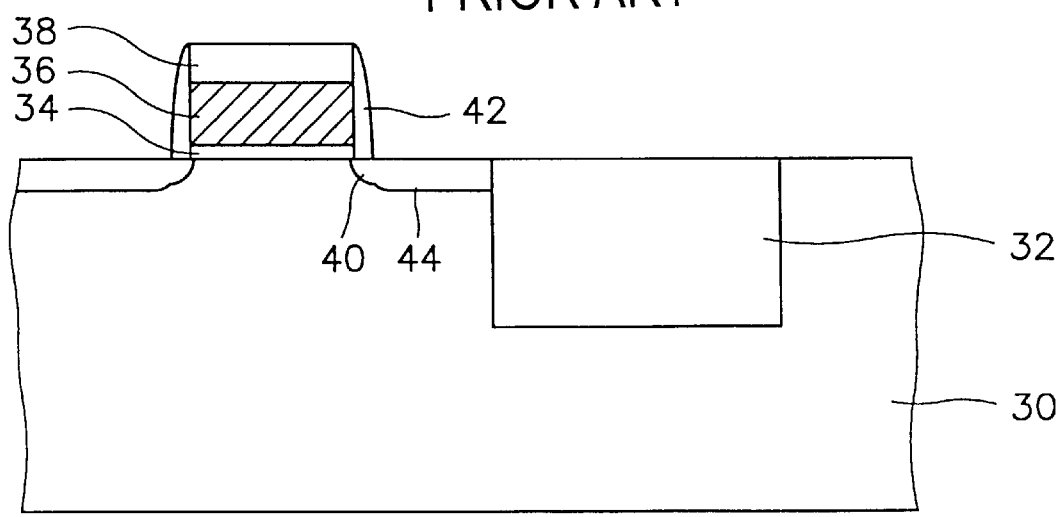
Figure 2C:
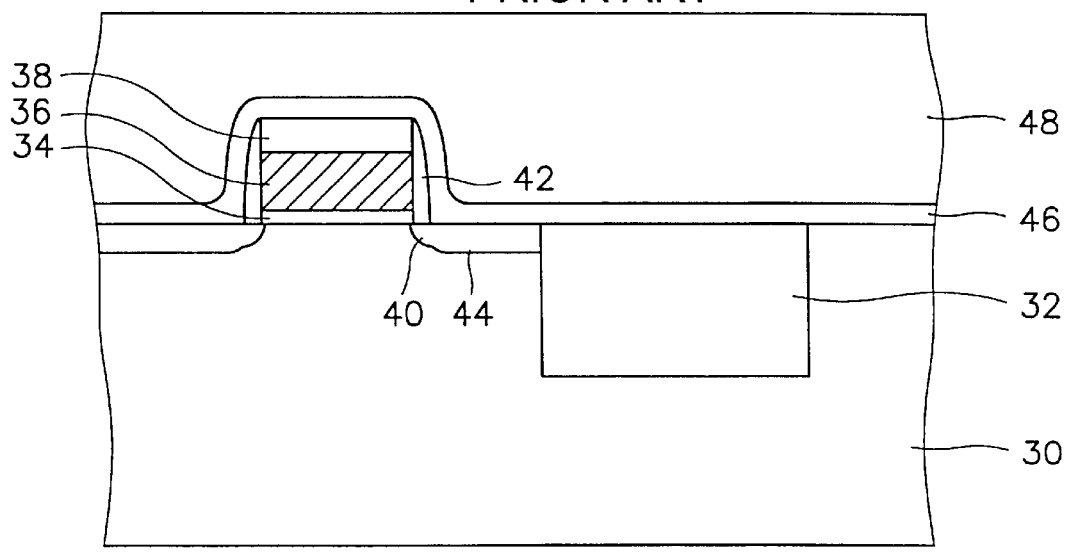
Figure 2D:
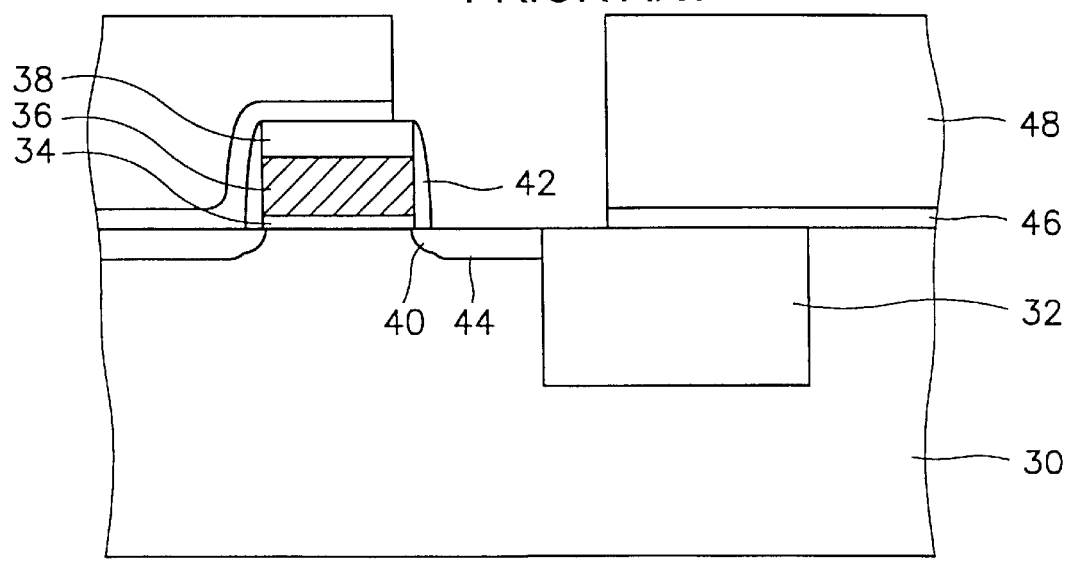
Figure 3A:
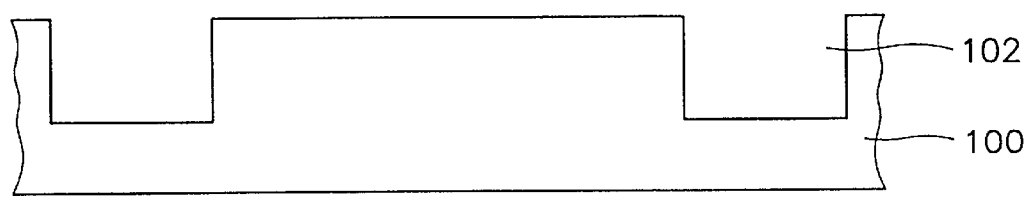

FIGS. 3A to 3M are cross-sectional views explaining a method of forming contact holes of a semiconductor device according to a preferred embodiment of the present invention. Referring to FIG. 3A, a mask pattern (not shown) is formed on a semiconductor substrate 100 to limit a region in which a field oxide layer is to be formed. For example, an integrated mask pattern including a pad oxide pattern and a nitride pattern formed on the pad oxide pattern is formed. The semiconductor substrate 100 is etched to form a trench 102 having a predetermined depth by using the integrated mask pattern as an etching mask. The trench 102 is formed by using a gas mixture including fluorine as an etching gas.

The trench 102 is generally formed to have a depth of about 4,000–6,000 Å from a surface of semiconductor substrate 100 and a width of about 4,000–6,000 Å. However, the size of trench 102 is not limited to these ranges but can be changed according to an integration degree of semiconductor devices, a shape of an isolated active region, a resolution of a photolithography, etc. Then, the mask pattern formed on semiconductor substrate 100 is removed.

Figure 3B:
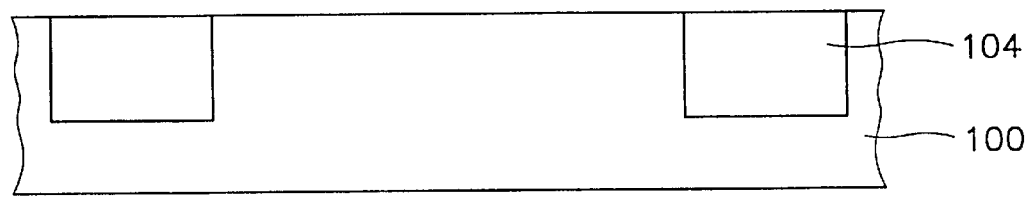

Referring to FIG. 3B, an oxide compound is blanket deposited on the whole surface of the semiconductor substrate 100 on which trench 102 is formed so that the trench 102 is filled with the oxide compound. As for the oxide compound, silicon oxide, TEOS (Tetra-Ortho-Silicate) and the like can be used and a chemical vapor deposition method is preferred. After that, a planarization process is implemented until the nitride pattern is exposed and then, the nitride pattern is removed. The pad oxide pattern formed under the nitride pattern is removed as well. At this time, the oxide compound is also etched to form a field oxide layer 104 within the semiconductor substrate 100. As for the planarization process, an etch back process or a CMP (Chemical Mechanical Polishing) process can be applied. Among these, the CMP process is preferred.

The semiconductor substrate 100 is thus separated into an active region and a field region by the field oxide layer 104, from the result of the planarization process. In the present invention, an STI (Shallow Trench Isolation) method is applied for isolating a device. However, a LOCOS (Local Oxidation of Silicon) method can also be applied for the isolation of the device.

Figure 3C:
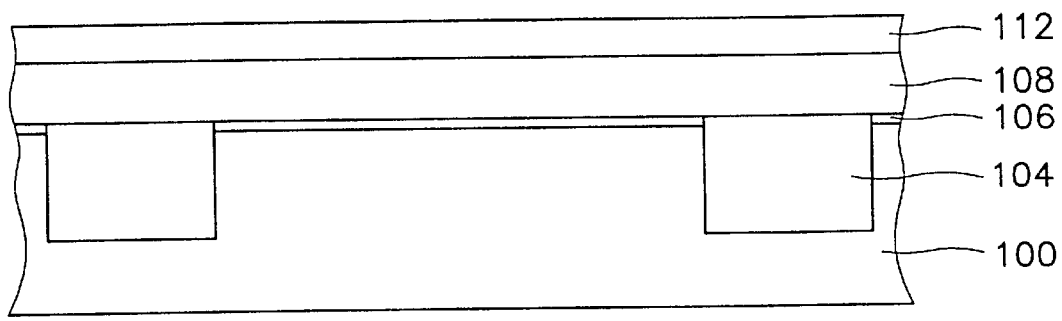

Referring to FIG. 3C, a thermal oxide layer 106 is formed on the active region of the semiconductor substrate 100 on which field oxide layer 104 is formed for the isolation of devices. On the active region, a plurality of devices including transistors might be formed. A thermal oxide layer 106 is formed by using a thermal oxidation method. Then, a conductive layer 108 and a capping layer 112 are subsequently formed on the active region and field oxide layer 104 of semiconductor substrate 100, on which thermal oxide layer 106 is formed.

The conductive layer 108 is formed from a conductive material such as an impurity doped polysilicon. In addition, the conductive layer 108 might further include a metal silicide layer. The metal silicide layer is formed by depositing at least one metal silicide selected from the group consisting of tungsten silicide ($WSi_x$), tantalum silicide ($TaSi_2$) and molybdenum silicide ($MoSi_2$) on the polysilicon layer to a predetermined thickness.

The capping layer 112 is formed by depositing a nitride compound such as silicon nitride (SiN) to a predetermined thickness by a low pressure chemical vapor deposition method. The capping layer 112 functions to protect the conductive layer 108 and thermal oxide layer 106 from a subsequent process and to prevent a current leakage flowing outward from conductive layer 108 which is formed from a conductive material.

Figure 3D:
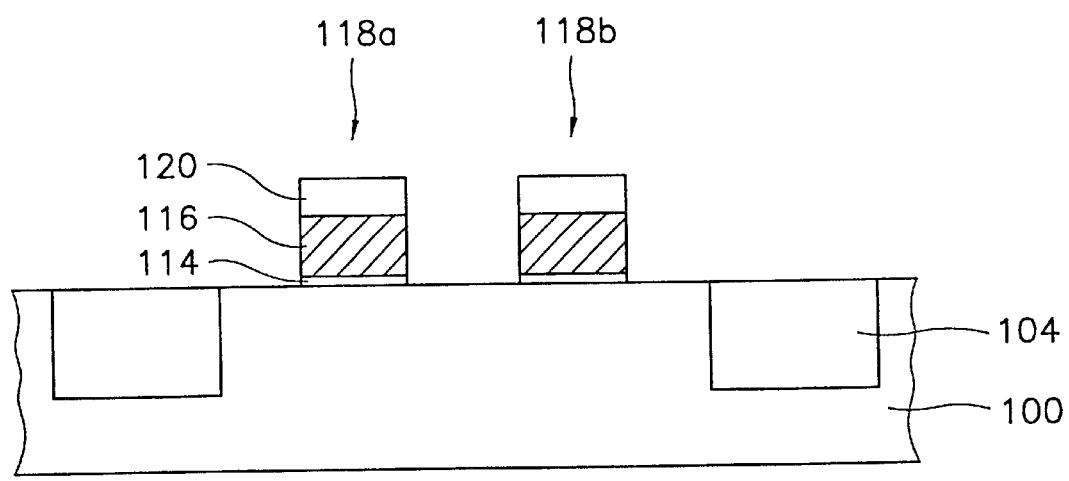

Referring to FIG. 3D, a photoresist pattern is formed on capping layer 112 as a mask pattern. Then, the capping layer 112, conductive layer 108 and thermal oxide layer 106 are subsequently etched by using the photoresist pattern as an etching mask, to form a plurality of gate electrodes 118a and 118b which include a gate oxide layer 114, a conductive pattern 116 and a capping layer pattern 120. The remaining photoresist pattern is subsequently removed.

Figure 3E:
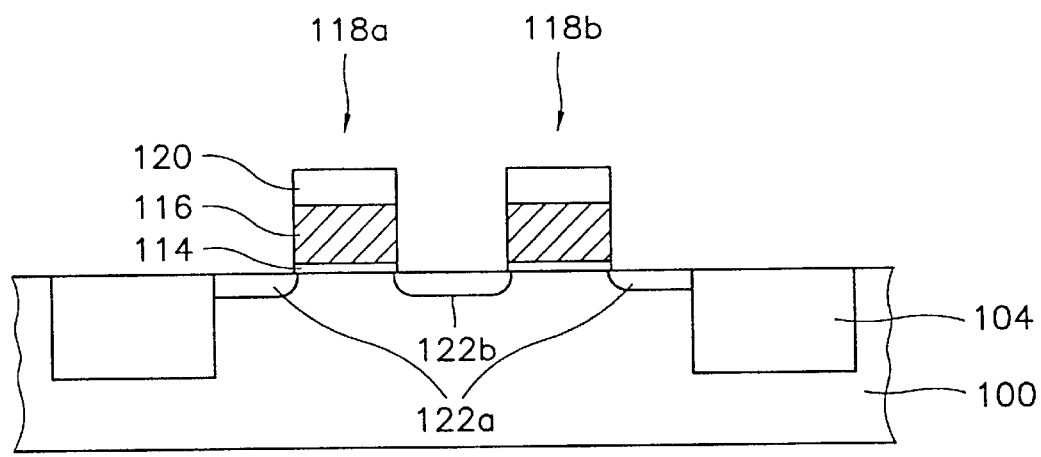

Referring to FIG. 3E, first impurity regions 122a and 122b are formed within the semiconductor substrate 100 by implementing an ion doping process using gate electrodes 118a and 118b as a mask. First impurity regions 122a and 122b are designated as LDD (Lightly Doped Drain) regions and are formed by doping impurities having a low concentration into the semiconductor substrate 100 to a shallow depth from the surface of the semiconductor substrate 100. Next, a heat treatment is implemented to activate the doped ions and to complement lattice damages of the semiconductor substrate 100 generated by the ion doping process.

Figure 3F:
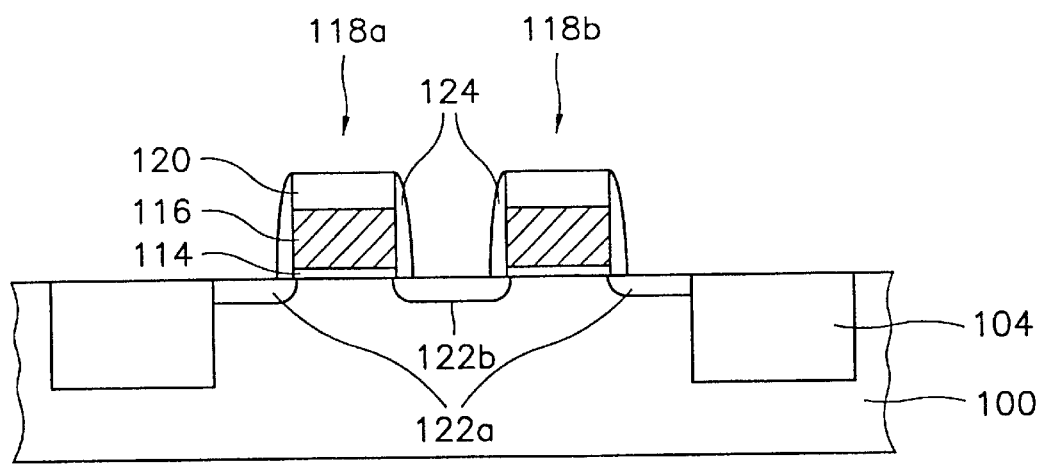

Referring to FIG. 3F, a first insulating layer (not shown) is formed on the semiconductor substrate 100 on which gate electrodes 118a and 118b and first impurity regions 122a and 122b are formed. The first insulating layer is formed by depositing a nitride compound such as silicon nitride to a thickness of about 1,000–1,200 Å. The first insulating layer is etched back until the surface of the semiconductor substrate 100 is exposed, to form first spacers 124 on the side walls of gate electrodes 118a and 118b. At this time, the thickness of first spacers 124 formed on the side walls of conductive pattern 116 (which is called a shoulder margin) is about 700 Å.

When the shoulder margin is too narrow, the distance between the polysilicon layer which is the conductive pattern 116 of gate electrodes 118a and 118b and the contact becomes narrow and a problem such as generation of current leakage occurs. When the shoulder margin is too broad, a sufficient borderless contact processing margin cannot be ensured.

Figure 3G:
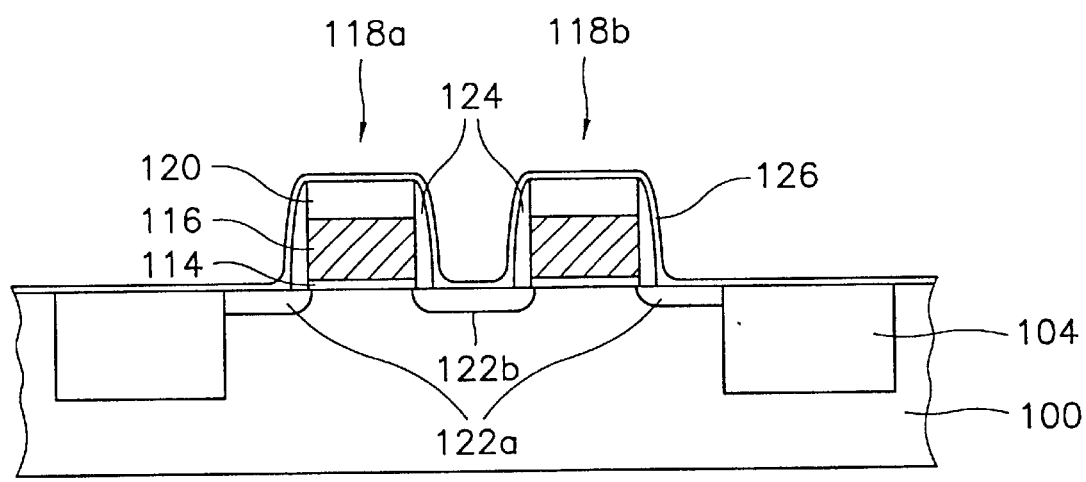

Referring to FIG. 3G, a second insulating layer 126 is formed on the whole surface of the semiconductor surface 100 on which first spacers 124 are formed. The second insulating layer 126 is formed by depositing an oxide compound, preferably, silicon oxide to a thickness of about 100 Å by means of a chemical vapor deposition method.

Figure 3H:
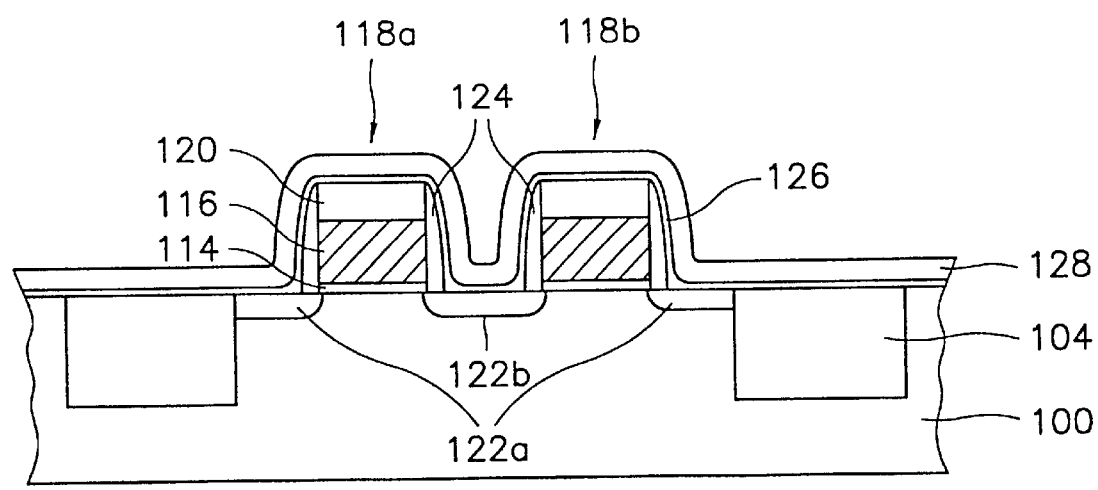

Referring to FIG. 3H, a third insulating layer 128 is formed on the second insulating layer 126. The third insulating layer 128 is formed by depositing a nitride compound, preferably silicon nitride (SiN) to a thickness of about 500–1,000 Å by means of a chemical vapor deposition method.

Figure 3I:
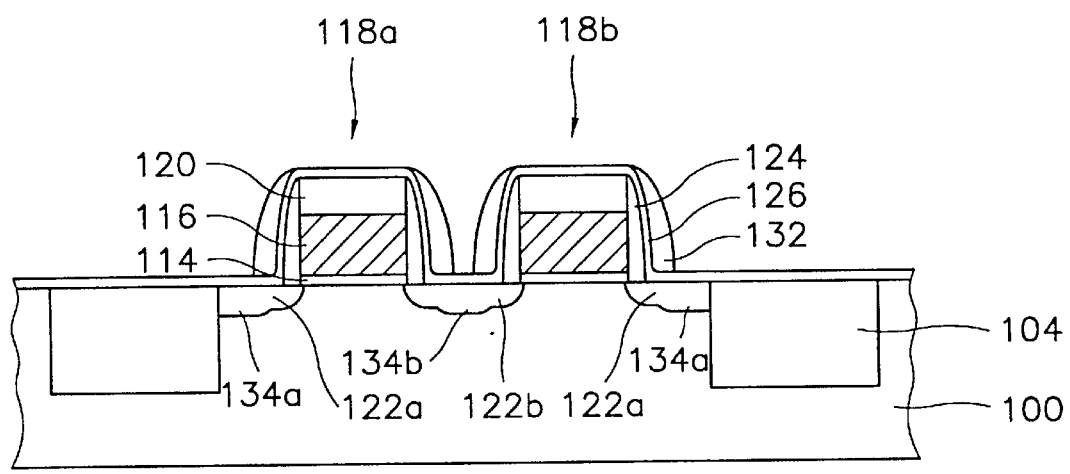

Referring to FIG. 3I, the third insulating layer 128 is etched back to form second spacers 132 on the side walls of gate electrodes 118a and 118b. This etch back process is implemented by using a gas mixture which has an etching ratio that is in the range of 5–6:1 for third insulating layer 128 with respect to the second insulating layer 126. Accordingly, during the implementation of the etch back process on the oxide layer which is formed with a similar material as that of the field oxide layer, a portion of the field oxide layer can be prevented from being etched according to the method of the present invention.

That is, in the conventional method, the second spacers are formed on the first spacers by implementing the etch back process on an oxide layer which is formed by an oxide compound such as silicon oxide. The thickness of the second spacers are about 200–800 Å. During the etch back process, a portion of the field oxide layer which is formed from the similar compound as the oxide layer is also etched. However, in the present invention, the second insulating layer 126 having a thickness of about 100 Å is formed prior to the third insulating layer 128, and then the third insulating layer 128 is etched back to prevent a portion of the field oxide layer from being etched.

Second spacers 132 prevent first spacers 124 from being etched during subsequent processes. Also, since the thickness of the second insulating layer 126 is about 100 Å, the third insulating layer 128 can also be etched to form second spacers 132 during the etch back process of the third insulating layer 126. As the second insulating layer 126 is thin, the field oxide layer is not seriously etched at this time.

Next, second impurity regions 134a and 134b are formed within the first impurity regions 122a and 122b of the semiconductor substrate 100 by implementing an ion doping process using gate electrodes 118a and 118b and second spacers 132 as a mask. Second impurity regions 134a and 134b are fully doped impurity regions with high concentration and are formed at deeper regions starting from the surface of the semiconductor substrate 100, compared to the first impurity regions 122a and 122b. Then, a heat treatment process is implemented to activate the doped ions and to cure lattice defects of the semiconductor substrate 100 induced by the ion doping process.

Figure 3J:
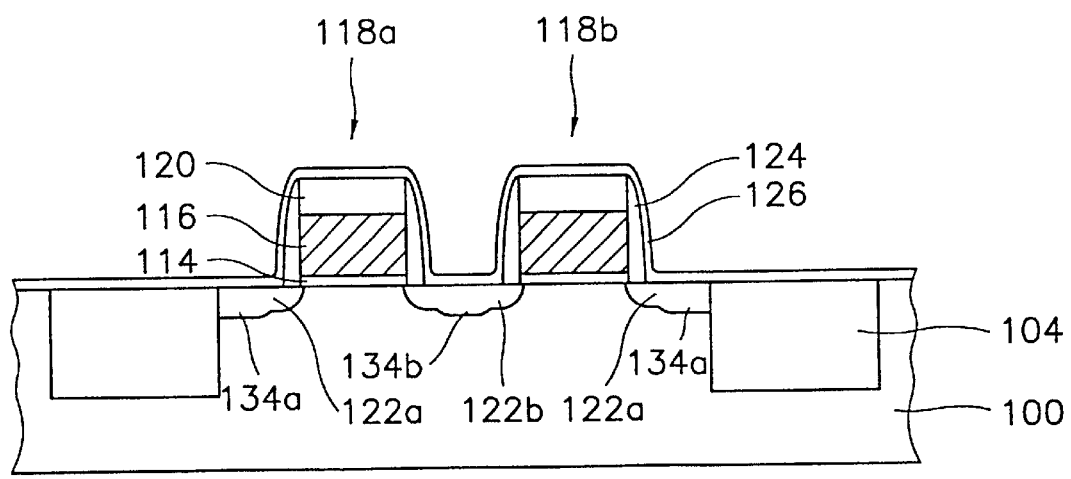

Referring to FIG. 3J, second spacers 132 formed on the side walls of gate electrodes 118a and 118b are removed. Second spacers 132 are removed by a wet etching method or a dry etching method. In the wet etching method, second spacers 132 are removed by using an etching solution including phosphoric acid ($H_3PO_4$) at about 80–200° C. In the dry etching method, second spacers 132 are removed by using a gas mixture of $CF_4$, $CHF_3$ and $O_2$.

When applying the wet etching method using the etching solution which includesphosphoric acid, second spacers 132 formed from the nitride compound are etched relatively fast compared to the second insulating layer 126 formed of the oxide compound. Therefore, second spacers 132 can be removed completely while the second insulating layer 126 and field oxide layer 104 are affected to a minimum degree. The active region and field oxide region 104 of the semiconductor substrate 100 can thus be prevented from being damaged during the etching process. The removing process of second spacers 132 is carried out until the second insulating layer 126 is exposed and a space for forming a first contact hole between gate electrodes 118a and 118b is surely provided.

In the semiconductor device of LDD structure which uses double spacers and which is formed by the conventional method, each spacer is formed to have a thickness of about 200–800 Å. Accordingly, the distance between gate electrodes where the first contact hole is formed is narrow. When a nitride compound is deposited to form an etch stopping layer to implement a borderless contact process, the narrow contact hole is completely filled with the nitride compound and the nitried compound is not removed completely during an etching process for forming the first contact hole.

In the present invention, second spacers 132 which are used to form an impurity region of high concentration in the LDD structure, are removed to widen the distance between gate electrodes 118a and 118b. So, a desired first contact hole can be obtained through a deposition of a nitride compound to form an etch stopping layer, which is followed by an etching process to the form contact holes.

Referring to FIG. 3K, an etch stopping layer 136 is formed on the whole surface of the semiconductor substrate 100 on which gate electrodes 118a and 118b, first spacers 124 and second insulating layer 126 are formed. The etch stopping layer 136 is formedby depositing a nitride compound, preferably a silicon nitride, to a thickness of about 300– 700 Å by means of a chemical vapor deposition method. A more preferred thickness of etch stopping layer 136 is about 500 Å. The etch stopping layer 136 prevents a portion of the field oxide layerfrom being etched during an etching process of an interlayer dielectric. The second contact is formed on the interlayer dielectric from a side portion of gate electrodes 118a and 118b, during a borderless contact process or a non-overlap contact process. The second contact is adjacent to the field region and a portion of the field oxide layer. The interlayer dielectric and the field oxide layer are formed of a similar material.

Then, the interlayer dielectric 138 is formed on the whole surface of the semiconductor substrate 100 on which etch stopping layer 136 is formed. The interlayer dielectric 138 is formed by depositing BPSG or PSG to a thickness of about 3,000–10,000 Å by using a low pressure chemical vapor deposition method or a plasma enhanced chemical vapor deposition method. At this time, a planarization process of chemical mechanical polishing can be further implemented to planarize the interlayer dielectric 138, after forming of the interlayer dielectric 138.

Referring to FIG. 3L, a photoresist pattern (not shown) is formed by depositing photoresist on the interlayer dielectric 138 and by implementing a common photolithography. Then, the interlayer dielectric 138 is etched by using the photoresist pattern as a mask. The interlayer dielectric 138 is etched by using a gas mixture which has an etching ratio of 10–15:1 for the interlayer dielectric 138 that is formed from an oxide compound, with respect to the etch stopping layer 136 which is formed from a nitride compound. The etching is carried out until the surface of etch stopping layer 136 is exposed.

Referring to FIG. 3M, the exposed etch stopping layer 136 and the underlying second insulating layer 126 are etched by using the interlayer dielectric 138 as an etching mask, to expose the surface of the semiconductor substrate 100. At this time, the etch stopping layer 136 and the second insulating layer 126 are anisotropically etched to form third spacers 140 which are formed from the second insulating layer 126 and fourth spacers 142 which are formed from the etch stopping layer 136.

The surface of the semiconductor substrate between gate electrodes 118a and 118b is exposed and the surface of the semiconductor substrate, that is, from the side portion of gate electrodes 118a and 118b which are adjacent to the field region to a portion of the field oxide layer, is also exposed to form the first and second contact holes. The first contact hole formed between gate electrodes 118a and 118b by a self aligned contact method, and the second contact hole formed from a portion of gate electrodes 118a and 118b to a portion of field oxide layer 104 by a borderless contact process, can be formed simultaneously in the present invention.

In the conventional method, a space between gate electrodes where the first contact hole is to be formed is filled with an etch stopping layer which is formed to apply the borderless contact method. However, this space is not completely etched during an etching process for forming the contact holes. If the etch stopping layer is completely etched to form desirable contact holes, the field oxide layer is damaged. Therefore, the borderless contact method and the self aligned contact method can not be applied simultaneously.

However, according to the present invention, the outermost second spacers 132 are removed after forming impurity regions 134a and 134b of the LDD structure, to ensure a space between gate electrodes 118a and 118b for the self aligned contact method. Then, etch stopping layer 136 is formed for the borderless contact process. Therefore, the thickness of etch stopping layer 136 formed on the field oxide layer 104 and that formed between gate electrodes 118a and 118b are controlled to be similar.

Accordingly, difficulties in removing the etch stopping layer 136 which is formed between gate electrodes 118a and 118b during an etching process of forming contact holes can be solved. As a result, the borderless contact method and the self aligned contact method can be simultaneously applied.

According to the present invention, a plurality of spacers are formed on the side walls of gate electrodes and impurity regions are formed in a semiconductor substrate. Then, the outermost spacers are removed to provide a region where the first contact hole is formed between the gate electrodes. An etch stopping layer which protects a field oxide layer while implementing a borderless contact process and an interlayer dielectric, are subsequently formed on the whole surface of the semiconductor substrate. The etch stopping layer and the interlayer dielectric are etched to form contact holes. The thickness of the etch stopping layer formed between the gate electrodes and that formed on the field oxide layer are almost similar. Accordingly, the surface of the semiconductor substrate between the gate electrodes can be completely exposed to form a desired first contact hole after completing the etching process of the etch stopping layer.

In addition, a self aligned contact method by which the first contact hole for exposing the surface of the semiconductor substrate between the gate electrodes is formed, and a borderless contact method by which the second contact hole for exposing the surface of the semiconductor substrate from a side portion of the gate electrodes which is adjacent to the field region to a portion of the field region, can be simultaneously applied in order to simplify the manufacturing process of semiconductor devices.

Furthermore, a thin second insulating layer is formed from a similar material as the field oxide layer on first spacers and a third insulating layer having different etching ratio with that of the second insulating layer is formed on the second insulating layer. Accordingly, during the formation of second spacers by etching back the third insulating layer, a portion of the field oxide layer which is formed from a similar material as the second insulating layer can be prevented effectively from being etched.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming contact holes in a semiconductor device comprising:

forming a plurality of gate electrodes on an active region of a semiconductor substrate, the gate electrodes having a plurality of spacers thereon and the semiconductor substrate being separated into the active region and a field region by a field oxide layer;

removing outermost spacers from the plurality of spacers on the plurality of gate electrodes, to provide a space for a first contact hole on the semiconductor substrate;

forming an etch stopping layer and an interlayer dielectric on the semiconductor substrate including the plurality of gate electrodes, after said removing; and simultaneously forming the first contact hole by exposing a first surface of the semiconductor substrate between the plurality of gate electrodes and forming a second contact hole by exposing a second surface of the semiconductor substrate, by etching the interlayer dielectric and the etch stopping layer, the second surface of the semiconductor substrate including a portion of a surface of the field oxide layer and a portion of the semiconductor substrate near the field oxide layer.

2. The method of forming contact holes in a semiconductor substrate of claim 1, wherein said forming a plurality of gate electrodes comprises:

forming a first insulating layer on the semiconductor substrate;

a plurality of gate electrodes on the first insulating layer;

forming a plurality of first spacers on side walls of the plurality of gate electrodes by etching back the first insulating layer;

forming second and third insulating layers on an entire surface of the semiconductor substrate, after said forming a plurality of first spacers; and forming a plurality of second spacers on the side walls of the plurality of gate electrodes by etching back the third insulating layer.

3. The method of forming contact holes in a semiconductor device of claim 2, wherein the first and third insulating layers are a nitride compound and the second insulating layer is an oxide compound.

4. The method of forming contact holes in a semiconductor device of claim 2, wherein the second insulating layer is formed by depositing an oxide compound having a thickness of less than about 100 Å on the entire surface of the semiconductor substrate, by a chemical vapor deposition method.

5. The method of forming contact holes in a semiconductor device of claim 1, wherein said forming a plurality of gate electrodes comprises:
   forming a plurality of gate electrodes on the semiconductor substrate, the plurality of gate electrodes having side walls without spacers thereon;
   forming a first impurity region by doping impurities having a low concentration into the semiconductor substrate, by using the plurality of gate electrodes as a mask; and
   forming a plurality of spacers on the side walls of the plurality of gate electrodes, after said forming a first impurity region.

6. The method of forming contact holes in a semiconductor device of claim 1, wherein the etch stopping layer is formed by depositing a nitride compound having a thickness of about 400–600 Å.

7. The method of forming contact holes in a semiconductor device of claim 1, wherein the interlayer dielectric is formed by depositing borophosphosilicate glass (BPSG) or phosphosilicate glass (PSG) having a thickness of about 3,000–10,000 Å, by a low pressure chemical vapor deposition or a plasma enhanced chemical vapor deposition.

8. A method of forming contact holes in a semiconductor device comprising:
   forming a field oxide layer on a semiconductor substrate that separates an active region of the semiconductor substrate from a field region of the semiconductor substrate;
   forming a plurality of gate electrodes on the active region;
   forming a first impurity region by doping impurities having a low concentration into the semiconductor substrate, using the plurality of gate electrodes as a mask;
   forming first spacers on side walls of the plurality of gate electrodes by forming a first insulating layer on an entire surface of the semiconductor substrate and by then etching back the first insulating layer;
   forming second and third insulating layers on the entire surface of the semiconductor substrate, after said forming first spacers;
   forming second spacers on the side walls of the plurality of gate electrodes by etching back the third insulating layer;
   forming a second impurity region by doping impurities having a high concentration into the semiconductor substrate, by using the plurality of gate electrodes having the second spacers thereon as a mask;
   removing the second spacers;
   forming an etch stopping layer and an interlayer dielectric on the entire surface of the semiconductor substrate, after said removing the second spacers; and
   simultaneously forming a first contact hole by exposing a first surface of the semiconductor substrate between the plurality of gate electrodes and forming second contact hole by exposing a second surface of the semiconductor substrate, by etching the interlayer dielectric, the etch stopping layer and the second insulating layer, the second surface of the semiconductor substrate including a portion of a surface of the field oxide layer and a portion of the semiconductor substrate near the field oxide layer.

9. The method of forming a contact hole in a semiconductor device of claim 8, wherein said forming a field oxide layer comprises:
   forming a trench within the semiconductor substrate, the trench having vertical side walls with respect to a surface of the semiconductor substrate; and
   filling the trench with an oxide compound by deposition of the oxide compound.

10. The method of forming a contact hole in a semiconductor device of claim 8, wherein the second insulating layer is formed by depositing an oxide compound having a thickness of less than about 100 Å on the entire surface of the semiconductor substrate, by a chemical vapor deposition.

11. The method of forming a contact hole in a semiconductor device of claim 8, wherein the first and third insulating layers are formed by depositing a nitride compound by a chemical vapor deposition.

12. The method of forming a contact hole in a semiconductor device of claim 8, wherein a thickness of the first spacers are in a range of about 600–800 Å.

13. The method of forming a contact hole in a semiconductor device of claim 8, wherein said forming second spacers comprises etching back the third insulating layer by using a gas mixture having an etching ratio of the third insulating layer with respect to the second insulating layer in a range of about 5–6:1.

14. The method of forming a contact hole in a semiconductor device of claim 8, wherein said forming an etch stopping layer comprises depositing silicon nitride by a chemical vapor deposition.

15. The method of forming a contact hole in a semiconductor device of claim 8, wherein the interlayer dielectric is formed from borophosphosilicate glass (BPSG) or phosphosilicate glass (PSG).

16. The method of forming a contact hole in a semiconductor device of claim 8, wherein said simultaneously forming a first contact hole and a second contact hole comprises:
   etching the interlayer dielectric using a gas mixture of which an etching ratio of the interlayer dielectric with respect to the etch stopping layer is in a range of about 10–15:1; and
   etching the etch stopping layer and the second insulating layer until a surface of the semiconductor substrate is exposed.

17. A method of forming contact holes in a semiconductor device having an active region with gate electrodes formed thereon and having a field region separated from the active region by field oxide, the method comprising:
   forming at least one first contact hole that is self-aligned, between the gate electrodes; and
   forming at least one second contact hole by a borderless contact process, on a portion of a gate electrode to a portion of the field oxide,
   said forming at least one first contact hole and said forming at least one second contact hole occurring simultaneously,
   said forming at least one first contact hole comprising forming first impurity regions of low concentration between the gate electrodes, using the gate electrodes as a mask, forming first spacers on side walls of the gate electrodes, after said forming first impurity regions, forming an insulating layer on an entire surface of the semiconductor device including the gate electrodes, the first spacers, the first impurity regions and the field oxide, forming second spacers on the insulating layer at the side walls of the gate electrodes, forming second impurity regions of high concentration between the gate electrodes, using the gate electrodes with second spacers as a mask, removing the second spacers, forming an etch stop layer and an interlayer dielectric on the entire surface of the semiconductor device, after said removing the second spacers, and etching through the interlayer dielectric, the etch stop layer and the insulating layer to form the at least one first contact hole between the gate electrodes.

18. The method of forming contact holes of claim 17, wherein said forming at least one second contact hole comprises said etching through the interlayer dielectric, the etch stop layer and the insulating layer, at the portion of the gate electrode to the portion of the field oxide.

* * * * *